(12) United States Patent
Milich et al.

(10) Patent No.: US 7,420,224 B2
(45) Date of Patent: Sep. 2, 2008

(54) ACTIVE RECTIFIER MODULE FOR THREE-PHASE GENERATORS OF VEHICLES

(75) Inventors: Reinhard Milich, Reutlingen (DE); Dirk Balszunat, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 253 days.

(21) Appl. No.: 10/520,884

(22) PCT Filed: Apr. 16, 2003

(86) PCT No.: PCT/DE03/01275

§ 371 (c)(1),
(2), (4) Date: Aug. 17, 2005

(87) PCT Pub. No.: WO2004/008618

PCT Pub. Date: Jan. 22, 2004

(65) Prior Publication Data

US 2006/0151874 A1    Jul. 13, 2006

(30) Foreign Application Priority Data

Jul. 10, 2002    (DE) ................... 102 31 091

(51) Int. Cl.
*H01L 23/34* (2006.01)

(52) U.S. Cl. ................ 257/177; 257/181; 257/E25.014

(58) Field of Classification Search ................. 257/181, 257/E25.014, 177; 322/28
See application file for complete search history.

(56) References Cited

U.S. PATENT DOCUMENTS

| | | | | |
|---|---|---|---|---|
| 6,060,795 A | * | 5/2000 | Azotea et al. | ............... 307/150 |
| 2001/0012212 A1 | | 8/2001 | Ikeda | |

FOREIGN PATENT DOCUMENTS

| | | |
|---|---|---|
| DE | 197 09 298 | 9/1998 |
| DE | 101 62 075 | 5/2002 |
| FR | 2 786 657 | 5/2000 |

* cited by examiner

*Primary Examiner*—Minh-Loan T Tran
(74) *Attorney, Agent, or Firm*—Kenyon & Kenyon LLP

(57) ABSTRACT

A rectifier for rectifying alternating current into direct current is described, in which a three-phase generator includes a three-phase stator winding. The phases of the stator winding are triggered via switching elements of a power circuit. The power circuit is controlled via a control part, which includes a controller component. The rectifier includes a control part (control module) having control terminals and a power circuit (power module) controlled by the control module and optionally provided with a cooling device, in which all the power-conducting components are designed as power MOS components and integrated in a stacked construction.

22 Claims, 6 Drawing Sheets

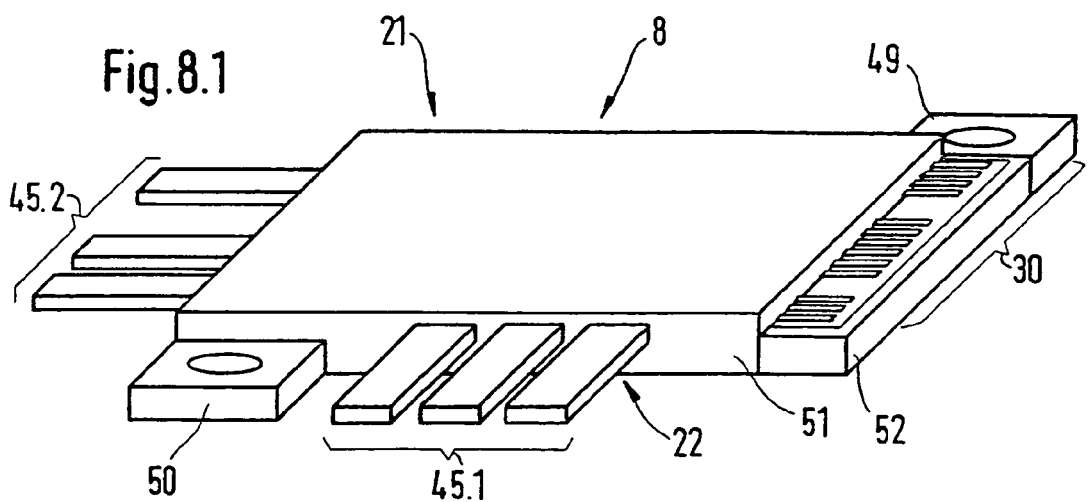
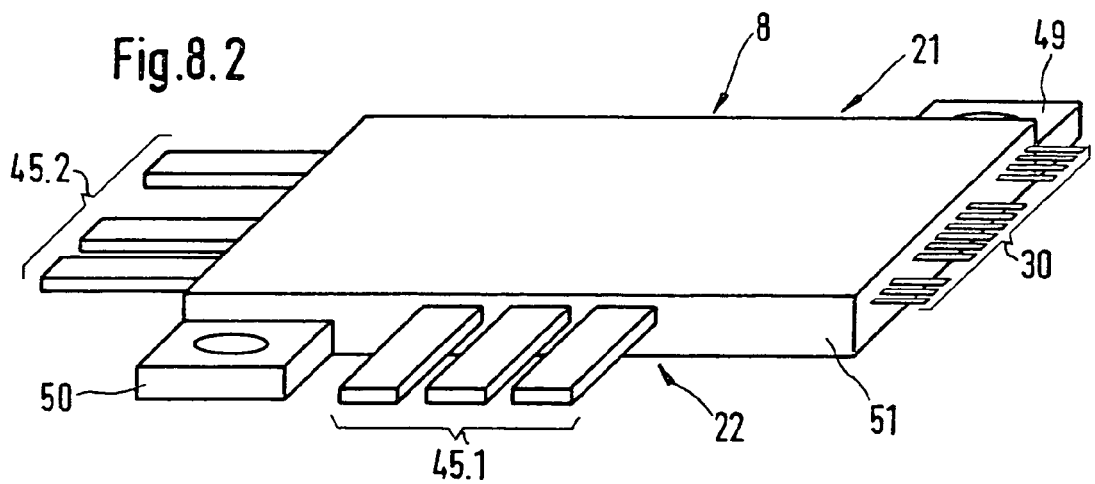
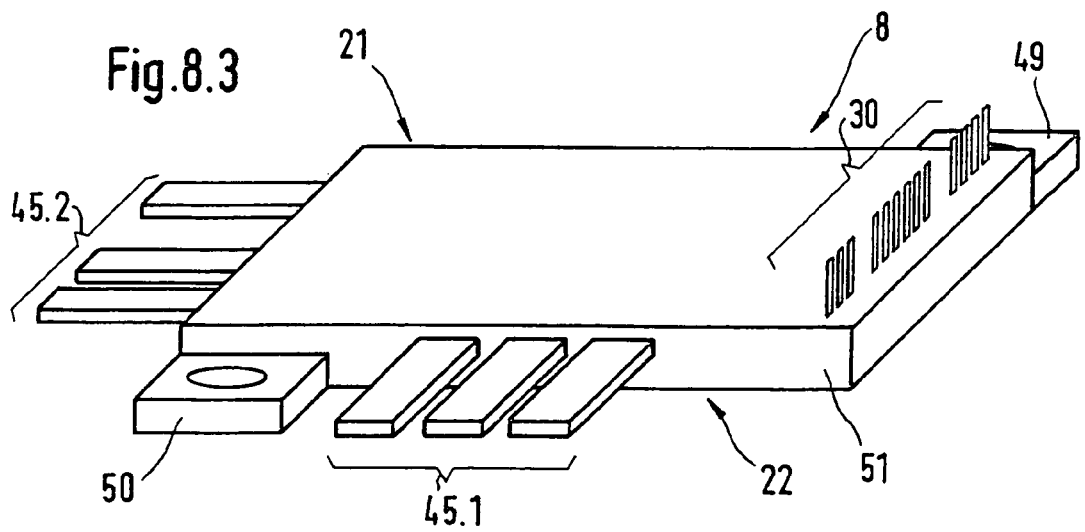

ACTIVE RECTIFIER MODULE FOR THREE-PHASE GENERATORS OF VEHICLES

FIELD OF THE INVENTION

Three-phase generators that supply sufficient current to the vehicle electrical system under all operating conditions are used in vehicles. This ensures that the vehicle battery as energy accumulator is always sufficiently charged. Three-phase generators for vehicles are designed for charging voltages of, for example, 14V, 28V, in commercial vehicles and in the future for the 42V vehicle electrical system so that 12V, 24V or 36V batteries may be sufficiently charged. The charging of vehicle batteries and the operation of electronic components and electrical devices require direct current so that the three-phase alternating current of the three-phase generator may be rectified into direct current using a rectifier.

BACKGROUND INFORMATION

Starter systems for internal combustion engines are known from German Patent No. 197 09 298. The starter systems have a DC link inverter. This includes a DC-AC converter, a short-term energy accumulator, as well as a vehicle electrical system DC voltage converter. The components mentioned are controlled via a control device. The control device tells the converter the amplitude, phase, and frequency of the three-phase current to be supplied to the starter of a vehicle. Using the control device, the amount of current, the current direction, and the amount of the current increase or decrease is specified to the DC voltage converter. Furthermore, the control device tells a consumer control device the amount of current that may be removed from a short-term energy accumulator and the voltage difference to be overcome in the removal, if necessary. The starter motor requires additional energy from the short-term energy accumulator during the start phase.

After the start, the starter motor works as a generator and provides the intermediate circuit with energy via the converter. The design of the vehicle electrical system DC voltage converter as a bi-directional converter makes it possible to bring electrical power from the vehicle battery into the intermediate circuit and to transfer power from the intermediate circuit to the low-voltage side when the starter motor is generator-operated after start. The vehicle electrical system's consumers may be supplied and the vehicle battery may be charged again during this process.

The subject matter of German Published Patent Application No. 100 62 075 A is a converter with integrated intermediate circuit capacitors. The converter is connected to a voltage intermediate circuit exhibiting a charge accumulator. The converter according to this approach may contain either a half-bridge circuit or a bridge circuit. This circuit forms a module situated in a housing. The charge accumulator is divided into several intermediate circuit capacitors, of which one, several, or all form an integrated component or components of the module.

In three-phase generators currently used in vehicles, their rectifiers are often made of passive components. High-blocking capability diodes or Zener-diodes may be used for this. High-blocking capability diodes work like a flow control valve and are therefore suitable semiconductor components for rectifying alternating currents. The current in blocking direction may be up to $10^7$ smaller in comparison with the forward current. The latter rises sharply with increasing temperature. In Zener-diodes (Z-diodes), when the voltage increases in reverse direction starting from the time a certain voltage is reached, there is a steep rise in the current as a result of the Zener and/or avalanche breakdown. Z-diodes are designed for continuous operation within the breakdown region. The most common type of assembly of the mentioned semiconductor components is pressing in the diodes into a heat sink or into a cooling plate. In addition, these diodes may also be pressed directly into the end shield of a three-phase generator. Aside from the semiconductor components, the electronics of the three-phase generator includes a controller with which the excitation current as well as the freewheel are controlled.

SUMMARY OF THE INVENTION

Through the proposed approach according to the present invention, an active rectifier is provided, which replaces the rectifiers containing the previous passive electronic components. The rectifier proposed according to the present invention containing the active electronic components furthermore has a separation between the power circuit and the control part. The separation of power circuit and control part on the rectifier made of active components considerably improves the efficiency that is obtained, since power MOS components (metal oxide semiconductors) are used as active electronic components, with which much higher generator power outputs may be rectified in contrast to passive electronic components such as high-blocking capability diodes. The rectification of higher generator capacities ensures the use of the active rectifier proposed according to the present invention within the 42V vehicle electrical system that is expected to be used in vehicles in the future, either as the vehicle electrical system or to supplement the previous 12V vehicle electrical system.

Since the power components are combined in a power circuit (power module), and sufficient heat dissipation should be provided here, a cooling device may be provided directly on the power circuit or integrated directly into this power circuit (power module). With the design according to the present invention of an active rectifier, the assembly costs are further greatly reduced and lower manufacturing costs per rectifier may be achieved.

In view of the expected use in the future of 42V vehicle electrical systems, for which there are no cost-effective passive components, such as Zener-diodes, a cost-effective alternative which lowers the unit cost per rectifier, may be provided by the approach proposed according to the present invention through the use of active components, such as power MOS components. The use of actively switching power MOS components is advantageous in that there is less electrical loss since the resistance of actively connected power MOS components is less than that of diodes in forward direction representing high-blocking capability passive components. Due to improved heat dissipation through a heat sink directly allocated to the power circuit, higher generator output powers that occur in the 42V vehicle electrical system may be rectified. In the event of a sudden load release (load dump), the behavior of the three-phase generator and the vehicle electrical system charge may be influenced favorably compared with the behavior in the case of rectifiers, by actively connecting the power MOS components using passive components and the occurrence of the Zener breakdown on the Z-diodes. The parameter variance of the Zener voltage caused by the component result in a wide vehicle electrical system voltage range with respect to the upper limit when a sudden load release (load dump) occurs. By actively connecting the power MOS components, this voltage range may be reduced with respect to the maximum occurring vehicle electrical system voltage $U_{max}$. Furthermore, there is much less tolerance in power MOS components for parameter variance caused by the component.

With the configuration according to the present invention of a rectifier containing an active component, the power losses in the rectifier during freewheeling may also be reduced through active connection of the power MOS components. With the proposed design approach, the power-conducting components assigned up to now to the controller, such as for example, field output stages and freewheeling diodes, may also be integrated into the power circuit. This makes it possible to concentrate the altogether necessary cooling effort to dissipate the heat on the power circuit (power module) and to greatly reduce the thermal power loss on the controller component. A further advantage is that a simplified assembly of the controller IC is achieved, in which the integration of the freewheeling diode and the field output stages into the power circuit (power module) considerably enhances the flexibility with respect to choosing where to mount the controller IC.

Client-specific differences with respect to the plug connections as well as the controller ASIC are limited to the control part (control module), while the power circuit (power module) of the active rectifier is not affected. The power circuit (power module) contains the active rectifier, the field output stage, and the freewheeling diode and provides an interface for the control part regardless of the client. The functionality required for controlling the active rectifier proposed according to the present invention, i.e., the gate driver, may be mounted in the controller ASIC in a single-chip approach. If the entire power circuit (power module) is designed such that it is soldered on both sides, production costs may be kept low since assembly lines with reflow soldering equipment or vacuum through-type furnaces may be used to manufacture these contacts and allow industrial scale manufacture, resulting in a lower unit cost per active rectifier according to the approach according to the present invention. An improved thermal connection may be established through soldering point contacts on both sides. Through the plastic extrusion coating method (molding), the active components, i.e., power MOS components, may be effectively protected from outside influences, such as splashed water, shaking and dirt accumulation, and at the same time offer level assembly surfaces for power circuits and control parts of the active rectifier which are stack-mounted, for example.

BRIEF DESCRIPTION OF THE DRAWINGS

FIGS. 8.1 to 8.3 show injection-molded power modules having connections in different variations extended outside on the sides;

DETAILED DESCRIPTION

Figure 1:
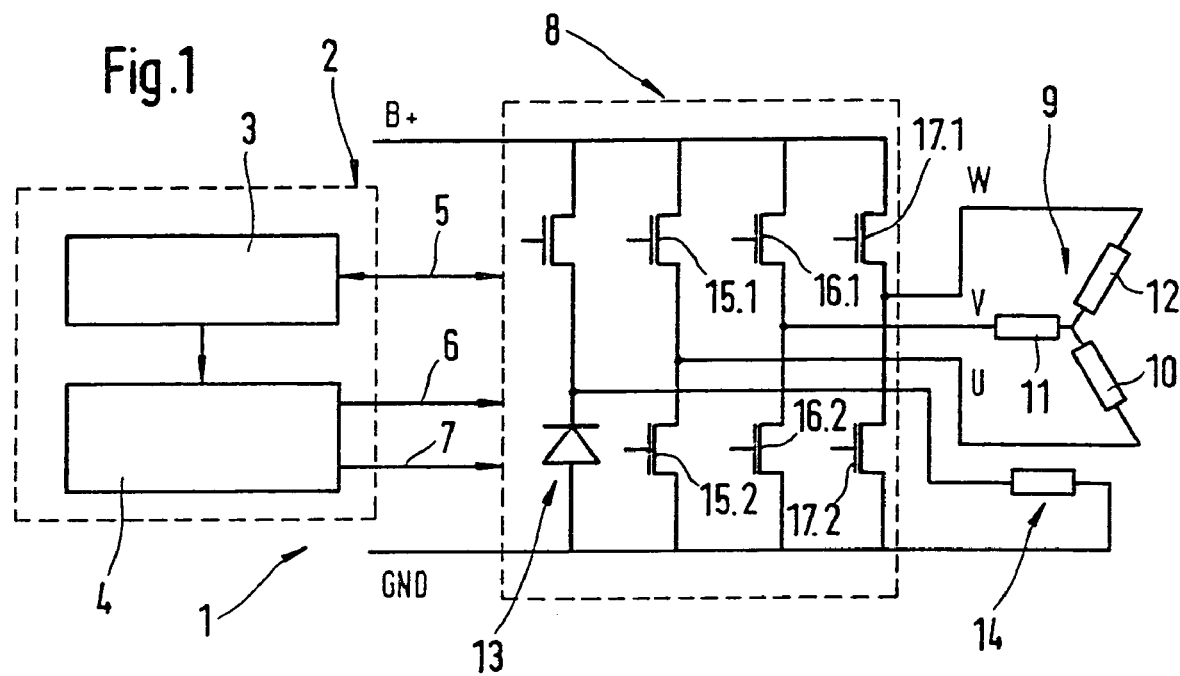
FIG. 1 shows the circuit of an active rectifier having a control part, power circuit, and their arrangement separate from one another.

FIG. 1 shows the circuit of an active rectifier having a control part, a power circuit, and their arrangement separate from one another.

An active rectifier 1 constructed according to the schematic diagram illustrated in FIG. 1 includes control part 2, which has controller IC 3 as well as a gate driver 4 triggered by the controller IC. Instead of the embodiment option of control part 2 (control module) in a multi-chip construction, as shown in FIG. 1, gate driver component 4 may also be integrated into controller IC 3, as a result of which control part 2 of active rectifier 1 is also implementable in a single-chip construction according to FIG. 1. In the illustrated exemplary embodiment according to FIG. 1, the controller IC is connected to power circuit 8 (power module), which includes power-conducting actively switching components, via a bi-directional control line 5. Gate driver 4 contained in control part 2 (control module) is connected to power circuit 8 (power module), preferably having a stacked construction 20, via a first control line 6 as well as a second control line 7. Power circuit 8 (power module) is configured preferably in stacked construction 20 illustrated in FIG. 2. Power circuit 8 (power module), according to the illustration in FIG. 1, includes transistors 15.1 and 15.2 taking over switching functions and preferably configured as power MOS components, through which a phase 10 (U) of a stator winding 9 of a three-phase generator is controlled. A further phase 11 (V) of stator winding 9 of the three-phase generator is controlled by transistor pair 16.1 or 16.2 of power circuit 8 (power module) containing the power-conducting component, while transistors 17.1 and 17.2 designed as power MOS components control phase 12 (W) of the three-phase stator winding 9 of a three-phase generator. Moreover, a freewheeling diode 13 which is allocated to an energizing field coil 14, through which three-phase stator winding 9 of the three-phase generator is energized, is accommodated in power circuit 8 (power module).

Figure 2:
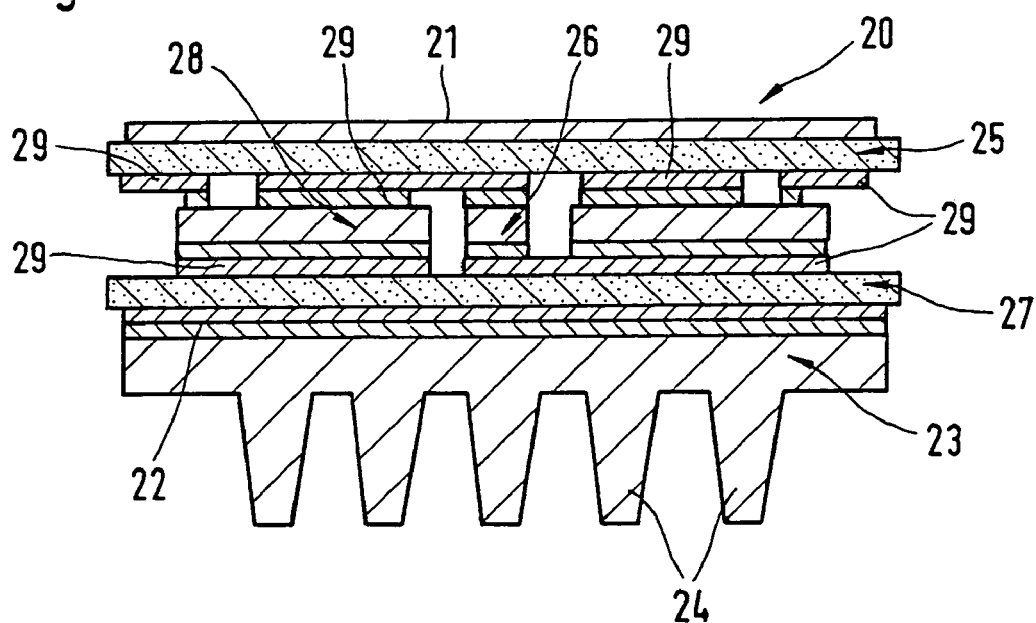
FIG. 2 shows the cross-section of a stacked construction made up of the heat sink, upper and lower DBC carrier substrate and actively switching components positioned between them.

According to this circuit of an active rectifier, all those components 15.1, 15.2; 16.1, 16.2; 17.1, 17.2 as well as 13 are mounted within power circuit 8 (power module). The control function is located in a single-chip or a multi-chip construction within control part 2 (control module), spatially separate from power circuit 8 (power module) of the active rectifier. FIG. 2 shows the cross-section of a stacked construction of a power module having a heat sink, an upper and a lower DBC carrier substrate, and actively switching power MOS components situated therebetween.

A variant of the above embodiment having the layer structure of a power circuit 8 (power module) according to the schematic illustration in FIG. 1 arises from the illustration according to FIG. 2. According to the embodiment shown in FIG. 2 of a possible stacked construction 20, this variant includes a first substrate 25 as well as a further, second substrate 27.

First substrate 25 and second substrate 27 may be designed as DBC carriers. DBC (direct bonded copper) represents a ceramic-based substrate material provided on both sides with a copper plating. Semiconductor components preferably designed as power MOS components 28 are mounted between first substrate 25 and second substrate 27 of stacked construction 20 according to FIG. 2. Actively switching power MOS components 28 are contacted on both sides via contacting surfaces 29. Contacting surfaces 29 may be manufactured by a surface soldering technique as well as via conductive adhesives. The possibility of manufacture using a soldering method that allows contacting on both sides facilitates a compact stacked construction 20 of the active rectifier at low production costs, while the thermal connection is greatly improved in comparison with conventional designs. In the exemplary embodiment of stacked construction 20 according to FIG. 2, heat sink 23 is mounted on bottom 22 of stacked construction 20, as the cooling device and is provided on its side facing away from stacked construction 20 with ribbing 24 to increase the heat-dissipating surface. Depending on the application, it is of course possible to position heat sink 23 functioning as a cooling device also on top side 21 of stacked construction 20 instead of its bottom side 22. Instead of heat sink 23 functioning as a cooling device with increased heat-dissipating surface 24, as illustrated in FIG. 2, stacked construction 20 of power circuit 8 (power module) may be contacted outward on the exterior, i.e., on top side 21 or on bottom side 22 also by applying a heat conducting paste to the surface. In this alternative embodiment of stacked construction 20 of power circuit 8 (power module) proposed according to the present invention, heat sink 23 may be omitted.

Instead of the stacked construction 20 variant illustrated in FIG. 2 of power circuit 8 (power module) of active rectifier 1 according to FIG. 1, stacked construction 20 may also contain a pressed screen on which the individual power-conducting components, preferably designed as power MOS components 28, are mounted. A second substrate layer 27, similar to stacked construction 20 according to the illustration in FIG. 2, on whose exterior heat sink 23 having enlarged heat-dissipating surface 24 may be mounted, may be located next to these two layers of a component representing stacked construction 20. Second substrate 27 according to this alternative embodiment of stacked construction 20 may be DBC. In a further alternative, possible embodiment of stacked construction 20 within power circuit 8 (power module), first substrate 25 as well as second substrate 27 may be replaced by an IMS substrate. An insulated strip conductor placed on an Al-carrier is referred to as an IMS substrate (insulated metal substrate).

Figure 3:
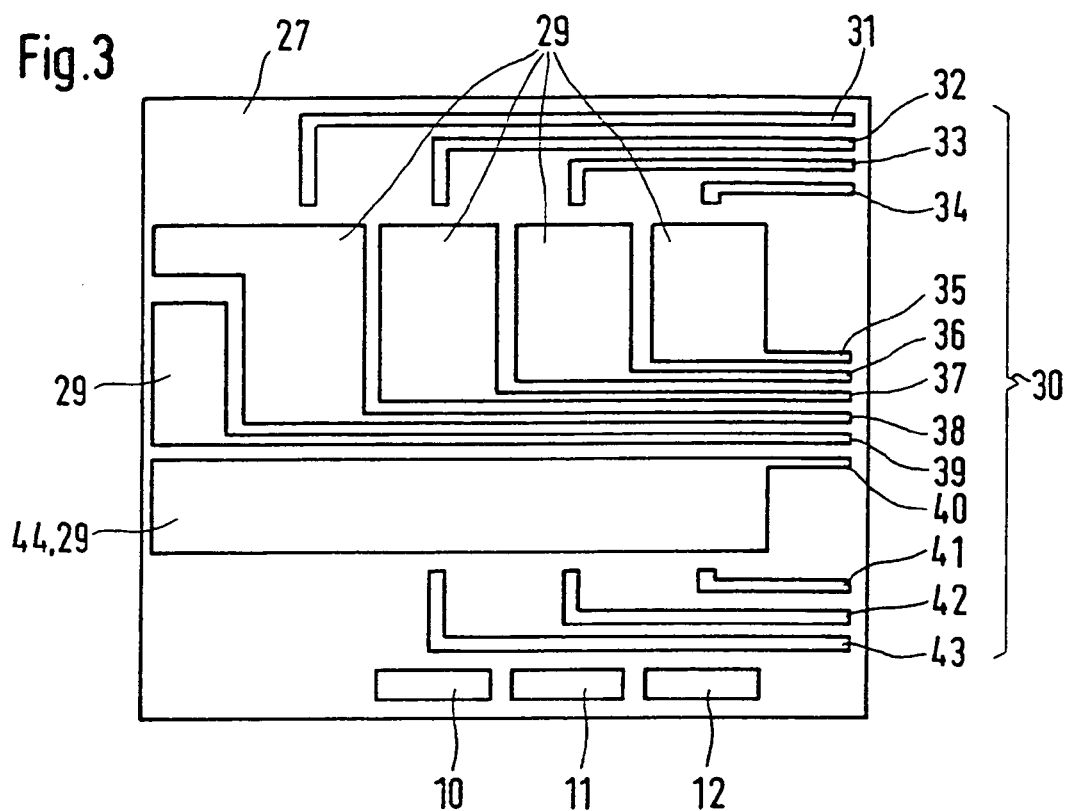
FIG. 3 shows the top view of the lower substrate of the stacked construction according to FIG. 2.

FIG. 3 shows the top view of a second substrate of a stacked construction according to the illustration in FIG. 2.

The top view illustrated in FIG. 3 of second substrate 27 of stacked construction 20 according to FIG. 2 shows that second substrate 27 is provided with contacting surfaces 29 on the side facing power MOS components 28. Contact surface 29 may be [manufactured] either by soldering or using conductive adhesives. All control and signal terminals, combined as control terminals and provided with reference number 30, are extended to the outside preferably on one side of second substrate 27 to form the application-specific interface for control part 2 (see illustration in FIG. 1), not shown in FIG. 3. Second substrate 27 may be executed as DBC as well as as IMS. Control terminals 30 include, specifically, a gate 31 for energizing feed coil 14, a gate 32 for high-side switch of phase U, a gate 33 for high-side switch for phase V of three-phase stator winding 9 of the three-phase generator, as well as a gate 34 for high-side circuit element of phase W of three-phase stator winding 9. Moreover, reference numbers 35, 26, 37 refer to the potentials of phases U and V and W, respectively, of three-phase stator winding 9. The potential connection for excitation field coil 14 is marked using reference number 38, while the voltage level is applied to gate 39.

Gate 40 refers to the grounding, while gates 41, 42 and 43 each refer to the drive terminals for the low-side switch of phases U, V and W, respectively, of three-phase stator winding 9 of the three-phase generator.

Figure 4:
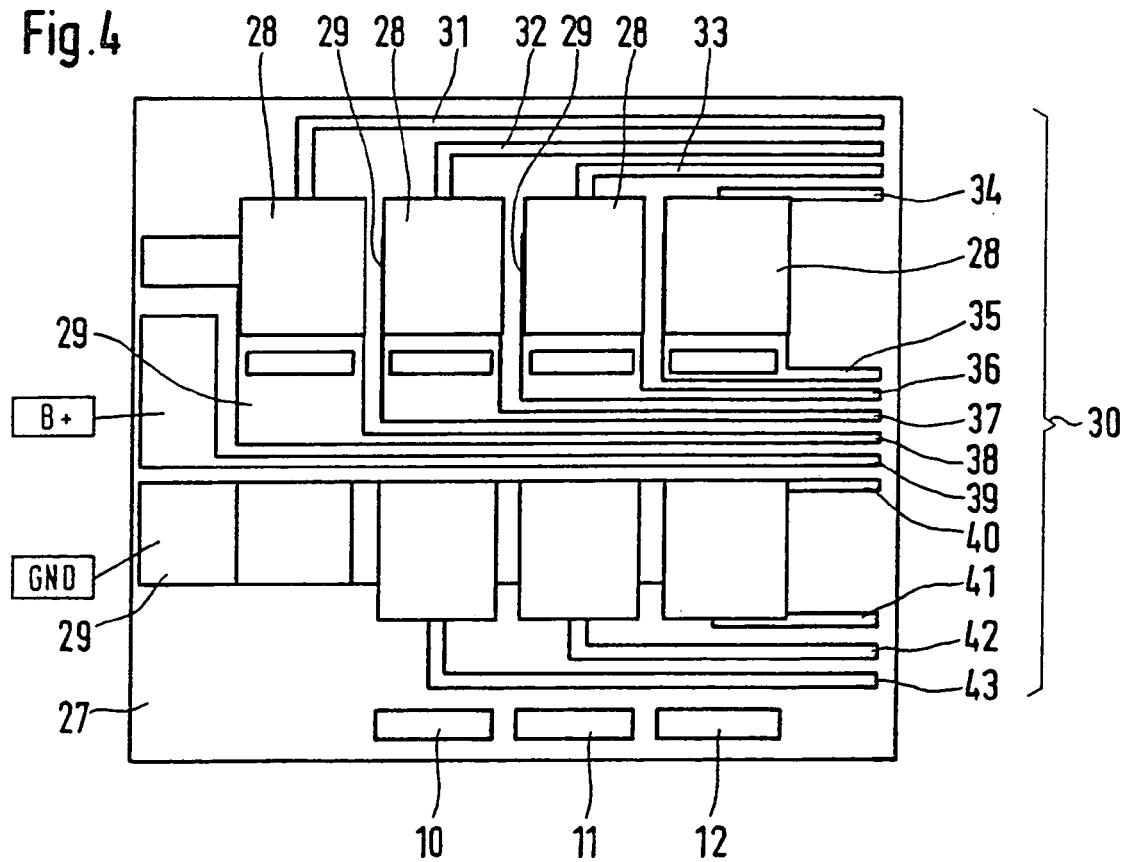
FIG. 4 shows the top view of the lower substrate, including power components and freewheeling diode placed on it.

FIG. 4 is the top view of the lower substrate of a stacked construction, having positioned power switching elements and freewheeling diode.

The top view reproduced in the illustration according to FIG. 4 is similar to the illustration of FIG. 3 with the exception that the individual power-conducting components preferably designed as power MOS components 28 are superimposed over contacting surfaces 29 shown in FIG. 3, be they produced by soldering or through conductive adhesives. Power-conducting components 28 forming power-conducting components 15.1 or 15.2 for phase U, power-conducting components 16.1 or 16.2 for phase V, and power-conducting components 17.1 or 17.2 for phase W of three-phase stator winding 9, shown in FIG. 1, are represented by two-dimensional sections and are furthermore covered by an upper substrate 25 not shown in FIG. 4 according to stacked construction 20, as can be inferred from the cross-section in FIG. 2. Drive terminals 30, which may for example be extended outside on an open side of second substrate 27 from power circuit 8 (power module), correspond to drive terminals 30 which were already mentioned and described in connection with FIG. 3.

Figure 5:
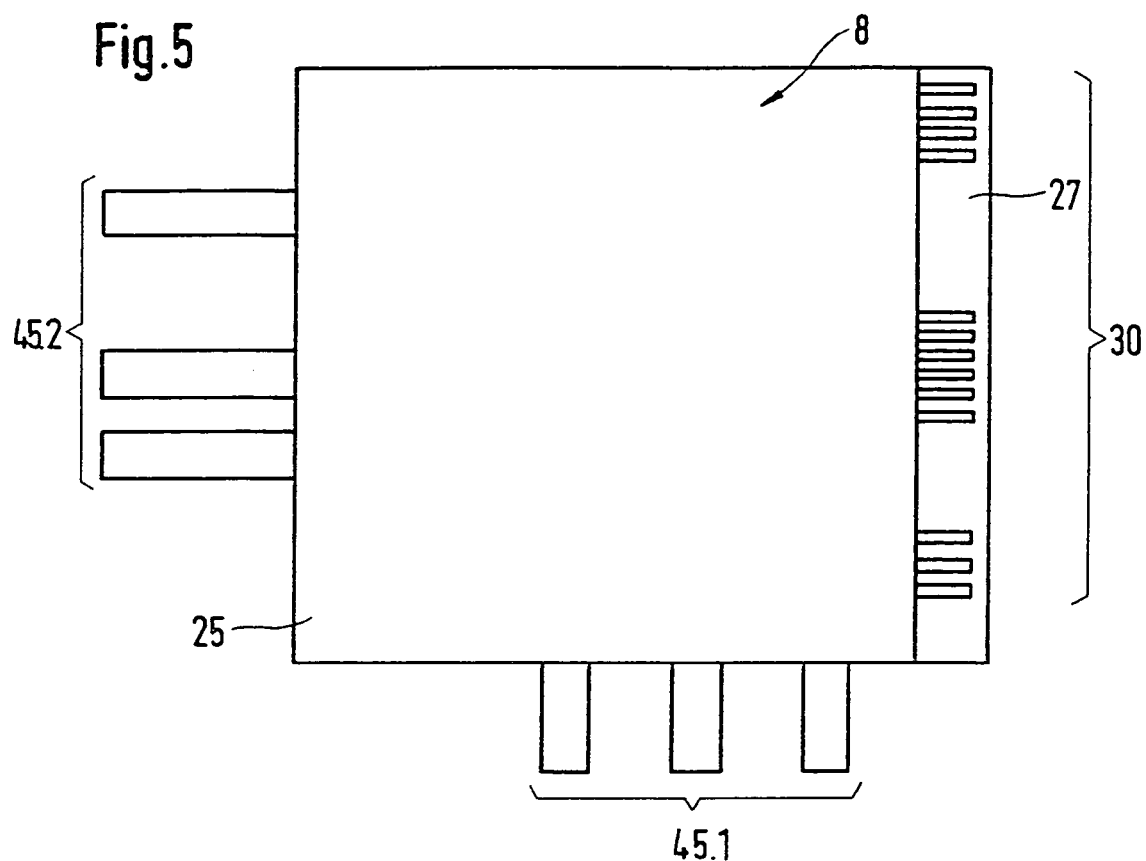
FIG. 5 shows a power circuit situated between substrates, having connections extending outside on the sides.

Power terminals that are extended outside on two sides from the power circuit are indicated in FIG. 5.

While the individual drive terminals 30 shown in greater detail in FIG. 3 and FIG. 4 respectively are extended outside from one side of power circuit 8 (power module), power terminals 45.1 or 45.2 arise through contacting between first substrate 25 and second substrate 27 according to stacked construction 20 (see illustration according to FIG. 2) formed contacts. In the top view according to FIG. 5, first substrate 25 has a smaller surface area than underlying second substrate 27. As a result, drive terminals 30 lie exposed on one side of power circuit 8 (power module) and may be therefore contacted by power circuit 2 (see illustration in FIG. 9), not shown in FIG. 5.

Figure 6:
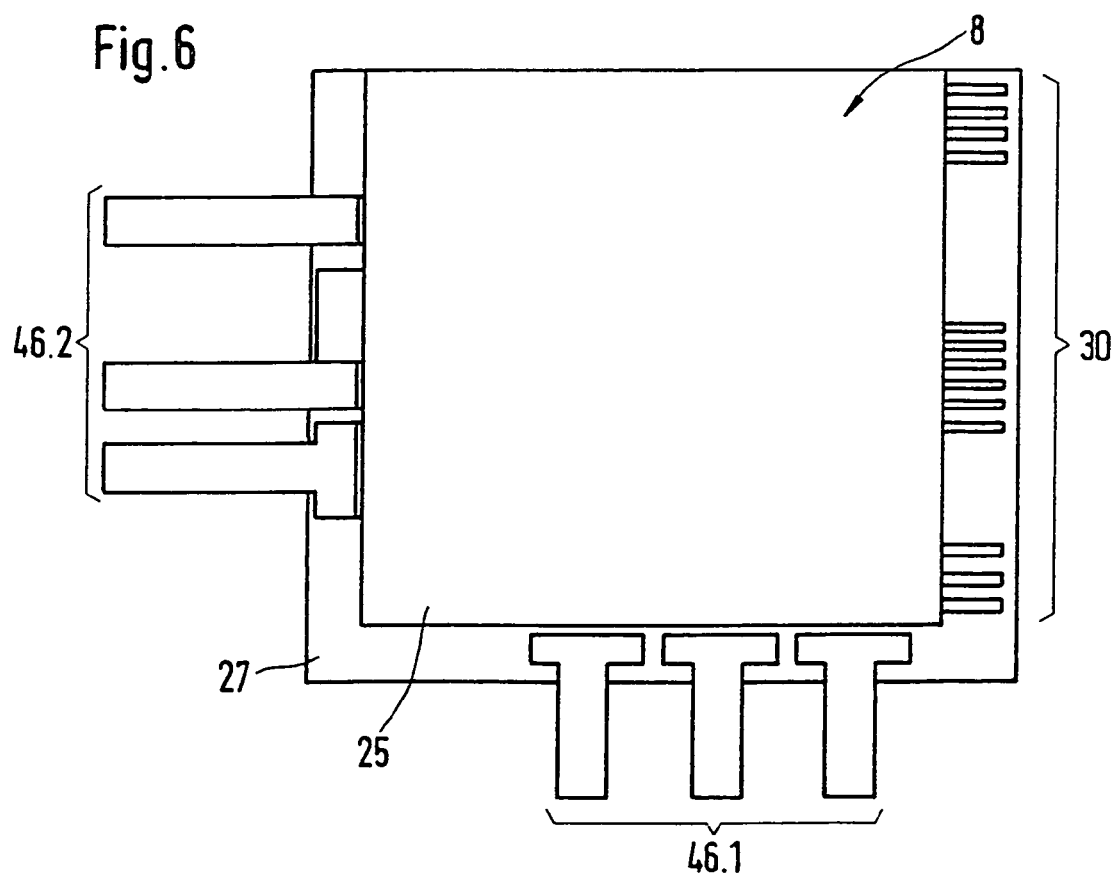
FIG. 6 shows a power circuit with the connections mounted.

As an alternative to the embodiment shown in FIG. 5 of power terminals formed as contacts between substrate surfaces, FIG. 6 shows an embodiment of power terminals that are installed.

It can be inferred from the illustration according to FIG. 6 that power circuit 8 (see stacked construction 20 in FIG. 2) includes first substrate 25 as well as second underlying substrate 27 according to FIG. 6, executed in DBC or IMS. First substrate 25 has a smaller surface area than the underlying illustrated second substrate 27. As a result, an edge area is formed on second substrate 27 in stacked construction 20, the edge area serving in the embodiment of power terminals 46.1 or 46.2 as contact points for contact elements to be placed on second substrate 27. Similar to the illustration of power circuit 8 (power module) according to FIG. 5, drive terminals 30 are combined on one side of power circuit 8 (power module), extended outside under first substrate 25, and lie freely accessible on an exposed section of second substrate 27 of stacked construction 20 (see FIG. 2).

Figure 7:
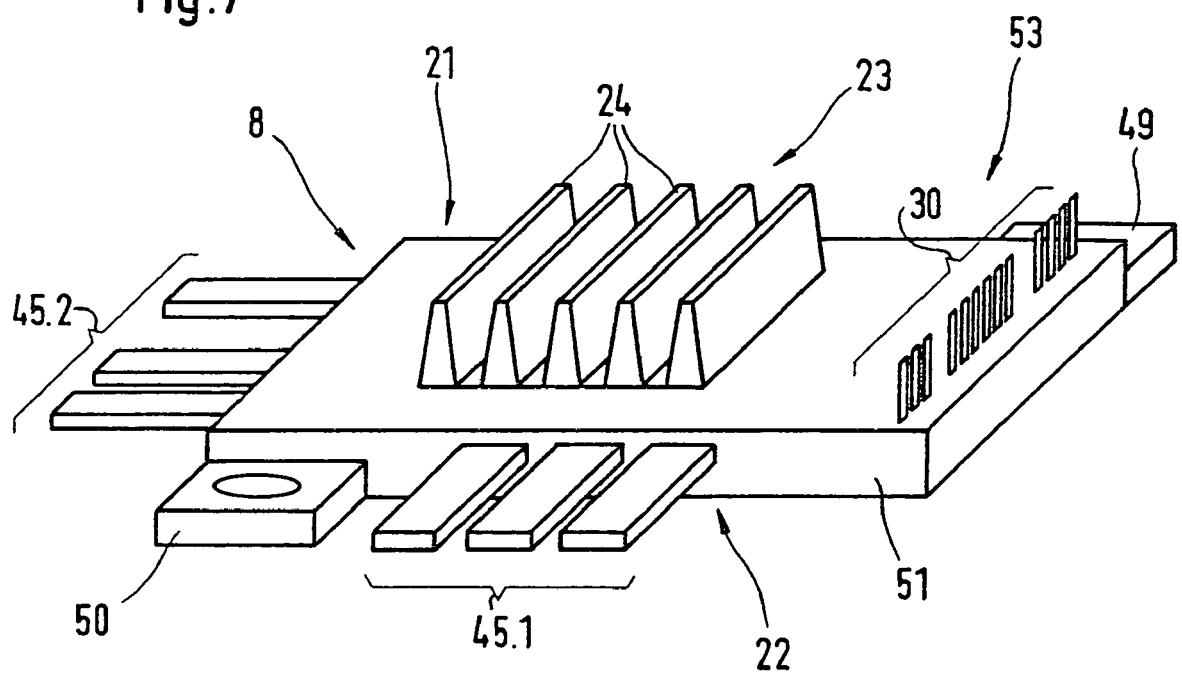
FIG. 7 shows a power module extrusion-coated using the extrusion coating method, having a heat sink situated on the top.

FIG. 7 shows a power circuit encapsulated by an injection molded material having a shifted heat sink positioned on its top.

FIG. 7 shows that the positioning of substrate surfaces 25, 27, not shown in FIG. 7, and the power-conducting components of active rectifier 1 preferably designed as power MOS components 28 and positioned therebetween may be encapsulated in a block-type manner by plastic material 51. These components may be effectively encapsulated by extrusion coating power-conducting components 28 with a plastic material. In the embodiment of a power circuit 8 (power module), the power terminals 45.1 or 45.2, which are extended outside on both sides of power circuit 8 (power module), are designed as contacts between first substrate 25 and second substrate 27, not shown here. Instead of injection molding material 51, power circuit 8 (power module) may alternatively also include a base plate on which fastening elements 49, 50 illustrated in FIG. 7—designed here as mounting straps—are situated. Mounting straps 49 and 50 of the base plate illustrated in FIG. 7 as an alternative, for example, may supplement or replace the effect of heat sink 23 having an enlarged heat transfer surface 24 situated on the top of power circuit 8 (power module). Mounting straps 49 or 50 may be provided with screw holes or rivet holes. Alternatively to this design, these screw holes or rivet holes in mounting straps 49 and 50 may also be located directly on ribbings 24 of heat sink 23 serving as a cooling device, which dissipates heat from power-conducting components 28. In the illustration of FIG. 7, drive terminals 30 for a power circuit not shown in FIG. 7 (see schematic illustration according to FIG. 1) extend upward in vertical direction 53. A control part 2 (control module) not shown in FIG. 7 may for example be plugged onto the level horizontal top side of power circuit 8 (power module) and consequently directly contact drive terminals 30 running upward in vertical direction 53.

Different embodiments of the outward extension of the drive terminals from power circuit 8 (power module) may be inferred from FIGS. 8.1 through 8.3.

It is common to the illustrations according to FIGS. 8.1, 8.2, and 8.3 that the power-conducting components not shown in detail in these figures, preferably designed as power MOS components, may be encapsulated by a plastic coating material indicated by reference 51, or power circuit 8 (power module) may include a base plate having fastening elements 49 or 50 extended outside on the sides. The power terminals for power-conducting components 28 situated in the interior in FIGS. 8.1, 8.2 and 8.3 are labeled with reference numbers 45.1 and 45.2. These are designed in the illustrations according to FIGS. 8.1, 8.2, and 8.3, as contacts between first substrate 25 and second substrate 27, likewise not shown. Alternatively, power terminals 45.1 or 45.2 may be designed according to the illustration in FIG. 6 as contacts placed on second substrate 27.

In the illustration according to FIG. 8.1, drive terminals 30 extend above an uncoated edge of second substrate 27 and are freely accessible for contacting control part 2 (control module) not shown in FIG. 8.1.

In the illustration according to FIG. 8.2, drive terminals 30 for contacting control part 2 (control module) likewise not shown in FIG. 8.2 extend outside on the sides of power circuit 8 (power module).

FIG. 8.3 shows drive terminals 30 extending outside vertically 53 upward from the interior of power circuit 8 (power module), comparable with the embodiment of a power circuit 8 (power module) shown in FIG. 7, which accommodates the power-conducting components of an active rectifier.

Although it is not shown in detail in FIGS. 8.1, 8.2 and 8.3, heat sink 23 shown in perspective top view in FIG. 7, having enlarged heat transfer surface 24, may be situated on top 21 as well as on bottom 22 of power circuit 8 (power module). Instead of the cooling device illustrated in FIG. 7, formed by heat sink 23, top 21 and bottom 22 of power circuit 8 (power module) illustrated in FIGS. 8.1, 8.2, and 8.3 may be provided with a heat conducting paste over a large surface area, through which the heat given off by power-conducting components designed as power MOS components 28 may be dissipated. In such cases, it is not necessary to provide ribbed heat sink 23 according to the illustration in FIG. 7 or according to stacked construction 20, shown in FIG. 2.

Figure 9:
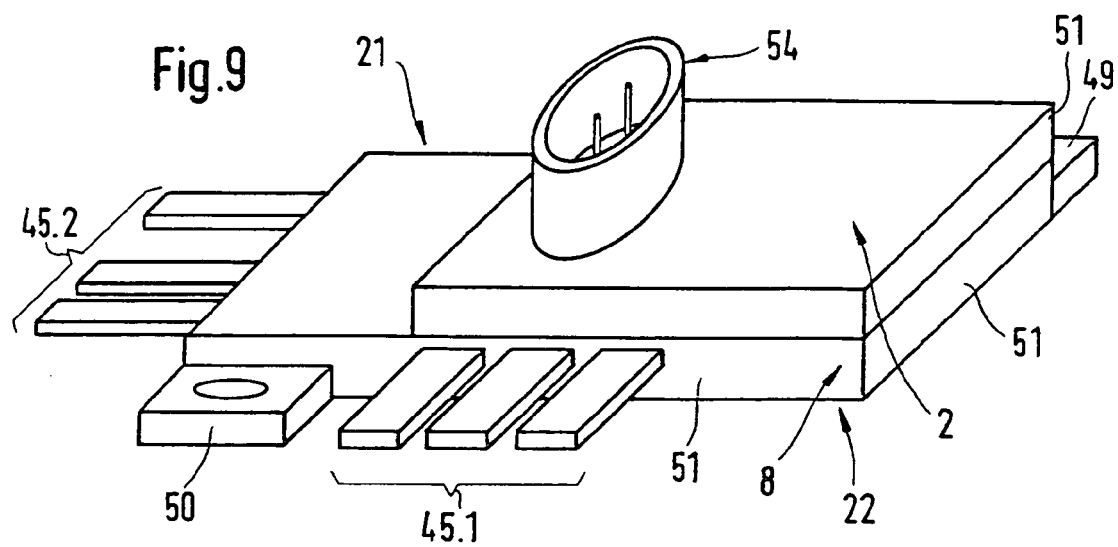
FIG. 9 shows an active rectifier having a control module mounted on a power module.

FIG. 9 shows an active rectifier having a control module placed on a power module.

From this embodiment, it may be inferred that control part 2 (control module) is placed on top 21 of power circuit 8 (power module). Top 21, essentially designed as a horizontal surface, represents the area for the placement of control part 2. Control part 2 may also have extrusion coating so that controller components 3 and 55 (not shown here) situated in the interior of control part 2 (control module) may be contacted through a single interface, i.e., the application-specific plug contact 54. Application-specific plug contact 54 attached in an easily accessible manner on the top advantageously allows client-specific variations, both regarding the plug contact and the controller IC used, to be reduced to a single component, namely control part 2. Power circuit 8 (power module) itself, containing active rectifier 1, one or several field output stages and freewheeling diode 13, provides a client-independent interface. The connection between power circuit 8 (power module) and control part 2 (control module) is not specific to the application and may be implemented through a simple clip-on using control terminals 30, shown in FIGS. 8.3 or 7, essentially extending in vertical direction 53.

Figure 10:
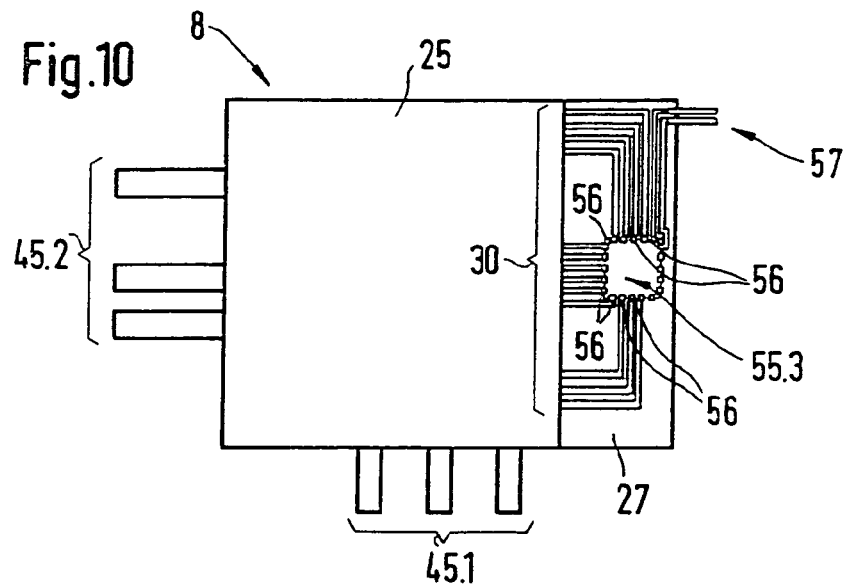
FIG. 10 shows an embodiment variant having a control IC standard-packaged into the power circuit.

FIG. 10 shows an embodiment having the control part with standard packaged IC mounted in the power circuit.

Power circuit 8 (power module) according to the illustration in FIG. 10 includes, for example, a standard packaged IC 55, which may serve as controller IC 3 (see illustration according to FIG. 1) mounted on second substrate surface 27. The power terminals are indicated with reference numbers 45.1 and 45.2, and are extended outside on the sides from power circuit 8 (power module). Drive terminals 30 indicated with reference number 30 are connected to contacting points 56 of IC 55. IC 55 itself may be triggered through control terminals 57, which are schematically indicated in FIG. 10. The illustration according to FIG. 10 furthermore shows that upper substrate 25 of power circuit 8 (power module) may be designed to fit a smaller space than second substrate 27 shown under it.

Figure 11:
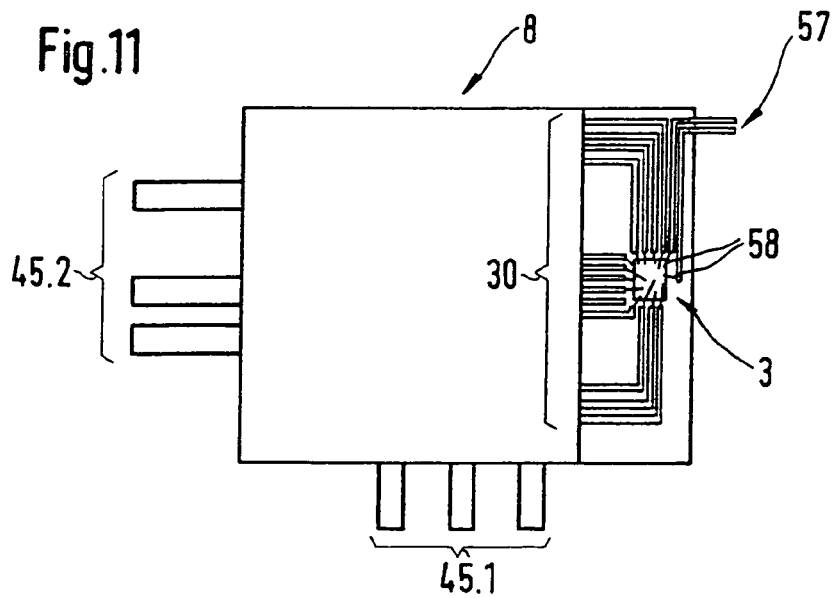
FIG. 11 shows an embodiment variant having a control part integrated into the power circuit, the IC of the control part being connected to the power circuit terminals through wire connections.

Power circuit 8 (power module) illustrated in FIG. 11 includes controller IC 3, connected via wire-bonded connections 58 to individual drive terminals 30 of power-conducting components 28, which are preferably designed as power MOS components. Controller IC 3 is also controllable via drive terminals 57 according to the illustration in FIG. 11; furthermore, power circuit 8 (power module) illustrated in FIG. 11 includes power terminals 45.1 or 45.2 which, according to the three-phase stator winding 9, are extended outward on the input side and on the output side from power circuit 8 (power module) of active rectifier 1.

The above approach shown in different embodiments provides an active rectifier 1 which may be installed in the 42V vehicle electrical systems to be used in the future, for which the cost-effective Zener-diodes representing passive components are not available for rectification. In the rectification carried out in active rectifier 1 using power MOS components 28, there are much less electrical losses because the resistance of actively connected power MOS components 28 is less than that of diodes in forward direction. Since higher currents may be handled, higher generator outputs necessary for the 42V vehicle electrical system may be rectified. Even in the event of a sudden load release, the behavior of the three-phase generator or of the vehicle electrical system may be favorably influenced through the use of power MOS components 28 through active connection. Furthermore, in active rectifier 1 proposed according to the present invention, the line losses in the active rectifier may be reduced during freewheeling through active connection. In addition, through a body diode, which is in the power MOS component as required by the process, freewheeling is also possible in the absence of a corresponding control signal.

Since the power-conducting components are combined in power circuit 8 (power module), effective cooling may be achieved on power circuit 8 (power module) either by positioning a heat sink 23 having enlarged heat-dissipating surface 24, or by applying a heat conducting paste that favors heat dissipation over a surface of top 21 or bottom 22 of housing 51, produced by the mold method, of power circuit 8 (power module).

The separation of functions between control part 2 (control module) and power circuit 8 (power module) facilitates the reduction of the thermal power losses of controller IC 3 or 55, which in previous modifications of the embodiment contained a field output stage and freewheeling diode 14 for the excitation current. Consequently, a substantially simplified assembly method for controller ICs 3 may be used, and flexibility with respect to the choice of mounting location is considerably increased. Using the approach proposed according to the present invention, client-specific differences with respect to the connector geometry and the choice of controller components 3 may be reduced to a single component, namely control part 2. Power circuit 8 (power module) itself, containing active rectifier 1, the field output stage, as well as freewheeling diode 13, provides a client-independent interface. The functionality required for controlling active rectifier 1 in the form of control driver 4 may be integrated into controller IC 3 in a single-chip construction and may also be accommodated in control part 2 (control module) as a separate chip component in a multi-chip construction. If stacked construction 20 is carried out in the above sketched embodiments using soldering technique on both sides or through conductive adhesives, a compact design of active rectifier 1 having lower production costs allows a much improved thermal connection compared to the usual stacked construction.

LIST OF REFERENCES

1 Active rectifier circuit
2 Control part
3 Controller IC
4 Gate driver
5 Bi-directional line
6 First control line
7 Second control line
8 Power circuit 8 (power module)
9 Stator winding
10 U phase
11 V phase of the stator winding
12 W phase
13 Freewheeling diode
14 Excitation field coil
15.1 1st Transistor U phase
15.2 2nd Transistor U phase
16.1 $1^{st}$ Transistor V phase
16.2 $2^{nd}$ Transistor V phase
17.1 $1^{st}$ Transistor W phase
17.2 $2^{nd}$ Transistor W phase
20 Stacked construction
21 Top
22 Bottom
23 Cooling device
24 Heat transfer surface
25 First substrate surface
26 Intermediate contacting
27 Second substrate surface
28 Active semiconductor component (MOS) metal oxide semiconductor
29 Contacting areas
30 Control terminals
31 Gate excitation winding
32 Gate high-side phase U
33 Gate high-side phase V
34 Gate high-side phase W
35 Potential phase U
36 Potential phase V
37 Potential phase W
38 Potential energizing field
39 B+
40 Ground
41 Gate low-side phase U
42 Gate low-side phase V
43 Gate low-side phase W
44 Contacting area of second substrate
45.1 Power terminals
45.2 Power terminals
46.1 Power terminals
46.2 Power terminals
47 Stacked first power terminals
48 Stacked second power terminals
49 First mounting strap
50 Second mounting strap
51 Injection molding material (molding)
52 Exposed second substrate
53 Vertical arrangement of control terminals 30
54 Application-specific plug
55 Standard packed IC
56 Contact for IC for control terminals 30
57 Control terminals IC
58 Wire bonding position

What is claimed is:

1. A rectifier for rectifying an alternating current into a direct current, comprising:
a control part including a controller component and control terminals;
a power circuit controlled by the control part and including switching elements,
wherein the control part is spatially separate from the power circuit; and
a three-phase generator including a three-phase stator winding, wherein:
phases of the stator winding are triggered via the switching elements,
all power-conducting components of the power circuit are power MOS components and are integrated in a stacked construction.

2. The rectifier as recited in claim 1, wherein the power-conducting components are power MOS components that are contacted on both sides.

3. The rectifier as recited in claim 2, wherein the power MOS components are contacted on both sides via contact surfaces serving as soldering points/soldering surfaces in the stacked construction.

4. The rectifier as recited in claim 2, wherein the power MOS components are contacted on both sides via contact surfaces serving as conductive adhesive surfaces in the stacked construction.

5. The rectifier as recited in claim 2, further comprising:
a cooling element, wherein the stacked construction of the power circuit includes a pressed screen and a first substrate, between which the power MOS components, contacted on both sides, are placed.

6. The rectifier as recited in claim 1, further comprising:
a cooling device, wherein:
the stacked construction of the power circuit includes a first substrate and a second substrate, between which the power MOS components are placed via contacts on both sides.

7. The rectifier as recited in claim 6, wherein the cooling device is situated on top of the stacked construction.

8. The rectifier as recited in claim 6, wherein the cooling device is situated on the bottom of the stacked construction.

9. The rectifier as recited in claim 6, wherein the power circuit contains power terminals as contacts between the first substrate and the second substrate.

10. The rectifier as recited in claim 6, wherein the power circuit includes power terminals that are placed on the first substrate of the stacked construction.

11. The rectifier as recited in claim 6, wherein power terminals of the power circuit extend outside on an exposed, coating-free surface of one of substrate surfaces of the stacked construction.

12. The rectifier as recited in claim 6, wherein the stacked construction includes a base plate having metallic fixing elements projecting from sides thereof.

13. The rectifier as recited in claim 6, wherein the control part includes one of a standard-packaged IC and an IC having a wiring, each having second control terminals and to which the control terminals of one of the first substrate and the second substrate are connected.

14. The rectifier as recited in claim 1, wherein the power circuit is contacted outward over a surface.

15. The rectifier as recited in claim 14, wherein the power circuit is contacted outward via a heat conducting paste applied over a surface for dissipating heat.

16. The rectifier as recited in claim 1, wherein the stacked construction of the power circuit includes an IMS substrate, to which the power MOS components are connected.

17. The rectifier as recited in claim 1, wherein the control part is designed in a single-chip construction and includes a controller-ASIC component having an integrated driver component.

18. The rectifier as recited in claim 1, wherein the control part is designed in a multi-chip construction having a separate controller-ASIC component and a separate driver component.

19. The rectifier as recited in claim 1, further comprising:
an injection molded material in which the power MOS components are encapsulated.

20. The rectifier as recited in claim 19, wherein the power terminals extend one of outside laterally and in a vertical direction from the power circuit.

21. The rectifier as recited in claim 1, wherein:
the control part is situated on a surface, made from injection molded material, of the power circuit and is connected thereto via the control terminals extending outside in a vertical direction.

22. The rectifier as recited in claim 1, wherein the control part includes an application-specific element.

* * * * *